United States Patent [19]

Soutar et al.

[11] Patent Number: 5,955,141
[45] Date of Patent: Sep. 21, 1999

[54] PROCESS FOR SILVER PLATING IN PRINTED CIRCUIT BOARD MANUFACTURE

[75] Inventors: Andrew McIntosh Soutar, London, United Kingdom; Peter Thomas McGrath, Mission Viejo, Calif.

[73] Assignee: Alpha Metals, Inc., Jersey City, N.J.

[21] Appl. No.: 08/932,392

[22] Filed: Sep. 17, 1997

Related U.S. Application Data

[63] Continuation of application No. 08/567,886, Dec. 8, 1995, abandoned.

[30] Foreign Application Priority Data

Dec. 9, 1994 [GB] United Kingdom .................... 9425030

[51] Int. Cl.$^6$ ......................................................... B05D 5/12
[52] U.S. Cl. ........................... 427/98; 427/125; 427/304; 427/307; 427/421; 427/405; 427/437; 427/443.1
[58] Field of Search ................................. 427/96, 97, 98, 427/125, 304, 307, 405, 421, 437, 443.1; 106/1.19, 1.23

[56] References Cited

U.S. PATENT DOCUMENTS

| | | | |
|---|---|---|---|
| 3,294,578 | 12/1966 | Popeck ..................................... | 117/130 |
| 3,993,845 | 11/1976 | Greenberg et al. ...................... | 428/433 |
| 4,067,784 | 1/1978 | Leahy et al. ............................ | 204/46 R |
| 4,777,078 | 10/1988 | Miyabayashi ............................ | 428/211 |
| 4,908,241 | 3/1990 | Quast et al. .......................... | 417/443.1 |
| 5,322,553 | 6/1994 | Mandich et al. ........................ | 106/1.23 |

FOREIGN PATENT DOCUMENTS

| | | | |
|---|---|---|---|
| 0 081 183 A1 | 6/1983 | European Pat. Off. | .......... C23C 3/00 |
| 2 201 163 | 8/1988 | United Kingdom | ............ C23C 18/42 |

OTHER PUBLICATIONS

Russev, D., Radev, D., and Karaivanow, S. Immersion silvering of copper "1252 Metal Finishing", vol. 81, No. 1 (Jan. 1983), pp. 27–30.

Dimiter Russev, et al., Metal Finishing, 81(1), 1252 (1983).

*Primary Examiner*—Brian K. Talbot
*Attorney, Agent, or Firm*—Mintz, Levin, Cohn, Ferris, Glovsky and Popeo, P. C.

[57] ABSTRACT

In PCB manufacture, the pads and/or through-holes of a bare board are protected prior to mounting of other components by a silver plating process. The silver plate is applied from a plating composition by a replacement process in which silver ions oxidized copper and deposit a layer of silver at the surface. In the aqueous plating composition the silver ions are maintained in solution by the incorporation of a multidentate complexing agent. The compositions may contain a silver tarnish inhibitor and are free of reducing agent capable of reducing silver ions to silver metal, halide ions and substantially free of non-aqueous solvent. Surface mounted components can be soldered direct to the silver coated contact using any commercially available solder. Silver does not deposit onto solder mask, but only onto metal which is less electropositive than silver.

36 Claims, No Drawings

PROCESS FOR SILVER PLATING IN PRINTED CIRCUIT BOARD MANUFACTURE

This application is a continuation of application Ser. No. 08/567,886, filed Dec. 8, 1995.

FIELD OF THE INVENTION

In the production of a printed circuit board (PCB), in a first (multi-step) stage a "bare board" is prepared and in a second (multi-step) stage, various components are mounted on the board. The present invention relates to the final steps in the manufacture of the bare board, in which the bare board is coated with a protective layer prior to passing to the second production stage.

PRIOR ART

There are currently two types of components for attachment to the bare boards in the second stage: legged components, e.g. resistors, transistor, etc. and, more recently, surface mount devices legged components are attached to the board by passing each of the legs through a hole in the board and subsequently ensuring that the hole around the leg is filled with solder. Surface mount devices are attached to the surface of the board by soldering with a flat contact area or by adhesion using an adhesive.

In the first stage, a board comprising an insulating layer, a conducting circuit pattern and conductive pads and/or through-holes is produced. The board may be a multi-layer board having more than one conducting circuit pattern positioned between insulating layers or may comprise one insulating layer and one conductive circuit pattern.

The through-holes may be plated through so that they are electrically conducting and the pads which form the areas to which the surface-mount components will be attached in the subsequent component-attachment stage, are also electrically conducting.

The conductive areas of the circuit pattern, pads and through-holes may be formed from any conductive material or mixtures of different conductive materials. They are generally however, formed from copper. Since over time, copper tends to oxidize to form a copper oxide layer with poor solderability, prior to passing to the second, component-attachment stage, a protective layer is coated over the pads and/or through-hole areas where it is desired to retain solderability to prevent formation of a poorly solderable surface layer of copper oxide.

Whilst there is more than one way for preparing the bare boards, one of the most widely used processes for making the bare boards is known as the "solder mask over bare copper" (SMOBC) technique. Such a board generally comprises an epoxy-bonded fiberglass layer clad on one or both sides with conductive material. Generally, the board will be a multi-layer board having alternate conductive layers which comprise circuit pattern, and insulating layers. The conductive material is generally metal foil and most usually copper foil. In the SMOBC technique, such a board is obtained and holes are drilled into the board material using a template or automated drilling machine. The holes are then "plated through" using an electroless copper plating process which deposits a copper layer on the entirety of the board: both on the upper foil surfaces and on the through-hole surfaces.

The board material is then coated with a light sensitive film (photo-resist), exposed to light in preselected areas and chemically developed to remove the unexposed areas revealing the conductive areas which are the plated through-holes and pads. Generally, in the next step, the thickness of the metal foil in the exposed areas is built up by a further copper electroplating step. A protective layer of a etch resist, which is usually a tin-lead alloy electroplate composition is applied over the exposed thickened copper areas.

The photo-resist is then removed exposing the copper for removal and the exposed copper surface is etched away using a copper etching composition to leave the copper in the circuit pattern finally required.

In the next step, the tin-lead alloy resist is stripped away.

Since components will not be attached to the copper circuit traces, it is generally only necessary to coat the solder for attaching the components over the though-hole and pad areas but not the traces. Solder mask is therefore applied to the board to protect the areas where the solder coating is not required, for example using a screen printing process or photo-imaging technique followed by development and, optionally curing. The exposed copper at the holes and pads is then cleaned and prepared for solder coating and the protective solder-coating subsequently applied, for example by immersion in a solder bath, followed by hot air leveling (HAL) to form a protective solder coating on those areas of copper not coated with solder mask. The solder does not wet the solder mask so that no coating is formed on top of the solder-mals protected areas.

At this stage, the board comprises at least one insulating layer and at least one conducive layer. The conductive layer or layers comprise a circuit trace. The board also comprises a pad or pads and/or through-hole(s) protect from tarnishing by layer of solder. A single conductive layer may comprise either a circuit trace or pad(s), or both. Any pads will be part of a conductive layer which is an outer layer of a multi-layer board. The circuit traces on the board are coated with solder mask.

Such a board is ready to proceed to the second stage for attachment of the components. In this second stage, generally attachment of the components is achieved using solder: firstly a layer of solder paste (comprising solder and flux) is applied onto the boards, generally by printing and the components are positioned on the printed boards. The board is then heated in an oven to produce fusion of the solder in the solder paste, which forms a contact between the components and the board. This process is known as reflow soldering. Alternatively a wave soldering process is used in which the board is passed over a bath of molten solder. In either case additional solder is used over and above any protective solder coating.

The additional complications for attaching both legged components and the surface mount devices and the special requirements for mounting many small closely spaced components have resulted in increase demands on the surface protection coating for the conducive metal to which the components will be attached, on the PCB's. It is essential that the finish applied by the bare board manufacturer does not leave a pad with an uneven surface as this increases the risk of electrical failure. It is also essential that the protective coating does not interfere in the subsequent to solder step, thereby preventing formation of a good, conducting bond between the bare board and components. An extra step on which the protective coating is removed would be undesirable.

As explained above, the conductive metal surfaces are generally formed of copper and the protective surface must be applied at the end of the first stage to prevent the formation of non-solderable copper oxide on the copper surfaces prior to the component attachment. This is particularly important because generally speaking, the first stage and the second, component-attachment stage will be carried out on completely different sites. There may therefore be a considerable time delay between formation of conducting pads and/or through-holes and the component attachment stage, during which time oxidation may occur. Therefore, a protective coating is required which will retain the solderability of conducting material and enable a soldered joint to be made when the components are attached to the bare boards.

The most common protection coating presently used is tin/lead solder, generally applied using the "HAL"(Hot air leveling) process, an example of which is described in detail above.

HAL processes are limited because it is difficult to apply the solder evenly and the thickness distribution produced by the use of HAL processes makes it difficult to reliably attach the very small and closely spaced components now being used. Several replacement treatments for the HAL coating of a solder layer are being introduced. The coatings must enable formation of a reliable electrical contact with the component. They should also be able to stand up to multiple-soldering steps. For example, as described above, there are now both legged and surface mounted components for attachment to the bare boards and these will generally be attached in at least two soldering operations. Therefore, the protective coatings must also be able to withstand at least two soldering operations so that the areas to be soldered in a second operation remain protected during the first operation.

Alternatives to the tin/lead alloy solder used in the HAL process which have been proposed include organic protection, immersion tin or tin/lead plating and nickel/gold plating. In the nickel/gold process electroless plating of the copper surfaces is carried out in which a primer layer of nickel is applied onto the copper followed by a layer of gold. This process is inconvenient because there are many process steps and in addition, the use of gold results in an expensive process.

Organic protection for the copper pads during storage and assembly prior to soldering have also been effected using flux lacquer. Its use is generally confined to single-side boards (i.e., boards which have conductive pads on only one side). The coating is generally applied by dip, spray or roller coating. Unfortunately, it is difficult to provide a consistent to coating to the board surfaces so limited life expectancy, due to the porosity of the coating and to its inconsistent coating thickness, results. Flux lacquers have also been found to have a relatively short shelf life. A further problem is that in the component-attachments stage, if reflow soldering is to be used to attach the components, the components are held in place on the underside of the boards with adhesive. In cases where flux lacquer is thick, the adhesive does not bond the component directly to the printed board, but instead forms a bond between the adhesive and the lacquer coating. The strength of this bond can drop during the fluxing and soldering step causing components to be lost during contact with the solder baths.

One other alterative currently being used is passivation/ protection treatment based upon the use of imidazoles or triazoles in which copper-complex compounds are formed on the copper surface. Thus, these coatings chemically bond to the surface and present the reaction between copper and oxygen. However this process is disadvantageous because it tends to be inadequate for withstanding successive soldering steps so that the high temperatures reached in a first soldering step tend to destroy the layer which cannot withstand a subsequent soldering operation needed to mount further components. One example of such a process is given in EP-A-0428383, where a process is described for the surface treatment of copper or copper alloys comprising immersing the surface of copper or copper alloy in an aqueous solution containing a benzimidazole compound having an alkyl group of at least 3 carbon atoms at the 2-position, and an organic acid.

Processes are also known which provide silver coatings on copper substrates using aqueous compositions which comprise solver using electroless techniques.

Electroless silver coating processes, which can also be used on non-metallic substrates, include a reducing agent and silver ions and a complexing agent. In GB-A-2201163 a thickened composition containing silver ions, complexing agent (in approximately equal weights) and reducing agent is applied to a metallic surface to provide a thick silver coating.

In Metal Finishing 81(1) 27–30 (1983) Russer et al. describe silver coating of copper powder by an immersion process in which the copper powder is immersed in a solution of silver nitrate and polyethylene polyamine in a molar ration of 1:2.

In U.S. Pat. No. 3,294,578 highly acidic solutions of silver salts containing hydrobromic or hydroiodic acid and a nitrogen containing complexing agent are used to give electroless silver coatings on more electronegative metal substrates. The compositions contained high quantities of non-aqueous solvents. A similar process is disclosed in U.S. Pat. No. 4,908,241 (EP-A-0081183).

The three common complexing systems for electroless silver plating processes are either ammonia-based, thiosulphate-based or cyanide-based.

The ammonia systems are disadvantageous because the ammonia-containing silver solutions are unstable and explosive azides may tend to form. Thiosulphate systems are disadvantageous for use in the electronics industry because sulphur compounds in the silver coatings formed result in poor solderability so that in the subsequent component-attachment step, a poor electrical contact may be formed between the bare board and the components.

The cyanide-based systems are disadvantageous due to the toxicity of the plating solutions.

In U.S. Pat. No. 5,318,621 an electroless plating solution containing amino acids as rate enhancers for depositing silver or gold onto a nickel coating overlying copper on a circuit board is disclosed. It is described that neither gold nor silver electroless plating baths based on thiosulphate/sulphate will plate directly onto copper because the copper rapidly dissolves without allowing a silver or gold coating to form. In the introduction of the reference, "Metal Finishing Guidebook & Directory" (1993 edition), silver plating solutions comprising silver nitrate, ammonia and a reducing agent such as formaldehyde are mentioned (i.e. electroless plating).

U.S. Pat. No. 4,863,766 also discloses electroless silver plating, using a cyanide-based plating solution.

SUMMARY OF THE INVENTION

The present invention relates to a displacement immersion silver-plating process. A displacement plating process differs from an electroless process because the silver coating forms on the surface of a metal by a simple displacement reaction due to the relative electrode potentials of the oxidizable metal of the surface to be protect and of the silver ions respectively.

It is reported in for example "Modern Electroplating" by F. A. Lowenheim, published by J. Wiley & Sons (1963) that silver will plate by displacement on most base metals but that immersion plated silver is poorly adherent. F. A. Lowenheim suggests that when electroplating base metals with silver, it is necessary to deposit first a thin film of silver on the work-piece from a high-cyanide strike bath to ensure good adhesion of the subsequent electroplated silver layer.

The present invention aims to provide an alternative to the solder protection coating for the conducting surfaces of bare boards which require protection from tarnishing between bare board manufacture and a component-attachment stage.

Surprisingly, in spite of the disclosure in "F. A. Lowenheim", the present inventors have found a method for plating by a displacement process which will provide good adhesion. The present invention overcomes the problems of the prior art silver protective coatings: ammonia, resulting in explosive solutions is not required; toxic cyanide ions can be dispensed with as no high cyanide first step is required; and a silver coating with good adhesion for PCB and solderability and providing protection against oxidation is formed.

In U.S. Pat. No. 4,777,078 a method is disclosed for forming copper wire patterns. The method uses an electroless copper plating bath intermittently containing solver ions which are used as a grain refiner to provide a reduction in grain size of the copper adjacent to a silver rich layer. The copper plating baths contain sodium iodide stabilizing agent, silver ions, EDNA, copper sulphate an sodium hydroxide and, especially, a reducing agent.

PREFERRED EMBODIMENT OF THE INVENTION

In accordance with the present invention, there is provided a process for forming a silver coating on a surface consisting of a metal which is less electropositive than silver comprising in a displacement plating step, contacting the metal surface with an aqueous displacement plating composition comprising silver ions and multidentate complexing agent in solution in an aqueous vehicle and have a pH of from 2 to 12.

As explained above, in the displacement process of the present invention, no additional ammonia, (which may be in the form of ammonium hydroxide), cyanide ions, formaldehyde, thiosulphate or reducing sugars are required.

The silver ions are present in the composition at a concentration of from 0.06 to 32 g/l (based on silver ions), preferably from 0.1 to 25 g/l, most preferably from 0.5 to 15 g/l.

As sources of silver ions, any water soluble silver salt may be used, for example nitrate, acetate, sulphate, lactate or formate. Preferably silver nitrate is used.

The complexing agent is preferably present in an amount of from 0.1 to 250 g/l, preferably from 2 to 200 g/l and most preferably from 10 to 100 g/l, especially around 50 g/l.

The complexing agent should be either in stoichiometric equivalent amounts or in a stoichiometric excess so that all the silver ion may be complexed. By stoichiometric we mean equimolar. Preferably the complexing agent is present in a higher molar concentration than the silver ions, the molar ratio preferably being (at least 1.2):1, more preferably (at least 2.0):1, more preferably (at least 3):1.

The complexing agent may be any complexing agent for silver ions which does not form a water insoluble precipitate under the aqueous and pH conditions of the composition. Mixtures of complexing agents may also be used. It is desirable to use complexing agents which are bi-dentate or higher dentate ligands since the stability constants of such complexes are higher than mono-dentate ligands. Examples of suitable complexing agents have oxygen-containing ligands, for instance amino acids preferably having at least 2 and up to 10 carbon atoms, polycarboxylic acids, usually amino acetic acids, such as nitrilo-triacetic acid or, usually, alkylene polyamine polyacetic acids including ethylene diamine tetra-acetic acid (EDTA), diethylene triamine penta-acetic acid (DTPA), N-hydroyethylethylene diamine triacetic acid, 1,3-diamino-2-propanol-N,N,N',N'-tetra-acetic acid, bishydroxyphenyl-ethylene diamine diacetic acid, diamino cyclohexane tetra-acetic acid or ethylene glycol-bis-[(β-aminoethylether)-N,N'-tetra-acetic acid] and N,N,N,N'-tetrakis-(2-hydroxypropyl)ethylene diamine, citrates, tartrates, N,N-di-(hydroxyethyl)glycine, gluconates, lactates, citrates, tartrates, crown ethers and/or cryptands.

Particularly preferred complexing agents are EDNA, DTPA and N,N,N',N'-tetrakis-(2-hydroxypropyl)ethylene diamine. The complexing agent should form a soluble complex with silver ions in aqueous solution under the pH conditions of the plating solution. We have discovered that for some compositions N-hydroxyethylethylene diamine tri-acetic acid, N,N-di(hydroxyethyl)glycine and bis (hydroxyphenyl) ethylene diamine diacetic acid form an insoluble complex.

The pH of the composition may be from 2 to 12, usually 3 to 10, but is preferably from 4 to 10. Thus, the composition may be acidic, up to pH 7. Alternatively, the composition may be alkaline, and have a pH of greater than 7, or even greater than 7.5.

A buffering agent may be included to ensure that the pH of the composition is maintained within the desired range. As the buffering agent, any compatible acid or base may be included. A compatible acid or base is an acid or based which in the amounts required in the composition does not result in the precipitation out of solution of the silver ions and/or complexing agent. For example hydrogen chloride is unsuitable as it forms an insoluble silver chloride precipitate. Suitable examples include sodium or potassium hydroxide or a carbonate salt, or where acids are required, suitable acids may include citric acid, nitric acid or acetic acid. Borates, phthalates, acetates, phosphonates may be used but the buffer should not result in precipitation of the metal salts and preferably does not inhibit the plating rate. An appropriate buffer will be dependent on the desired working pH.

The composition may include optional ingredients such as surfactants or wetting agents to improve the coating uniformity. Where surfactants are included, preferably they are introduced into the composition in an amount such that in the plating bath, they will be present at a concentration of from 0.02 to 100 g/l. Preferably they will be incorporated at a concentration of from 0.1 to 25 g/l and most preferably at a concentration of from 1 to 15 g/l. Any standard surfactant or wetting agent useful in a plating bath may be used. Nonionic surfactants are preferred. Particularly preferred surfactants are alkyl phenol ethoxylates, alcohol ethoxylates and phenol ethoxylates such as *Synperonic NP9 (ex ICI), *Synperonic A14 (ex ICI) and * Ethylan HB4 (ex Harcros), respectively (*denotes trade name).

A further optional ingredient which can be included in the plating baths of the present invention are grain refiners. Grain refiners improve the appearance of the silver coating by causing formation of smaller crystals of silver having a more densely packed structure. Suitable examples of grain refiners include lower alcohols such as those having from 1 to 6 carbon atoms, for example isopropanol and polyethylene glycols, for example PEG 1450 (Carbowax*, Union Carbide). Grain refiners may be incorporated in the composition in amounts from 0.02 to 200 g/l. More preferably, if a grain refiner is included, it will be at concentrations of from 0.05 to 100 g/l and most preferably from 0.1 to 10 g/l. Any non-aqueous solvent should be present in amounts below 50% by weight of the composition, preferably below 30% by weight or even below 10% or 5% by weight of the plating composition.

A further optional ingredient which may be included in the plating composition of the present invention are tarnish inhibitors. Inhibitors may be incorporated in amounts of from 0.001 to 50 g/l, preferably from 0.01 to 25 g/l and most preferably from 0.05 to 10 g/l. Suitable inhibitors are described in more detail in our co-pending application U.S. Ser. No. 08/567,335, now abandoned. They are inhibitors of silver tarnish. One example of a suitable inhibitor is an ethoxylated alkylamine (tertiary amine) such as Crodamet 02, or triazole derivatives, such as Reomet 42. The tarnish inhibitor should not be a reducing agent for silver ions.

Other non-active, non-interfering components may be included such as defoamers especially for spray applications (e.g., A100 supplied by Dow), dyes, etc.

The composition should be free of reducing agents which would be capable of reducing silver ions to silver metal. The bath is consequently stable. The composition should also be substantially free of non-aqueous solvent, although it may be necessary to use a non-aqueous solvent to introduce some components, such as some tarnish inhibitors, into the composition. In such cases it may be satisfactory for the non-aqueous solvent to remain in the composition.

The present inventors have found that the presence of halide ions can poison the plating composition. The composition is thus preferably substantially free of such ions.

The balance in the composition is water. Deionized water or other purified water which has had interfering ions removed, is used in the plating composition used in the process of the invention.

In order to form the plating composition for use in the process of the present invention, preferably a solution is firstly prepared comprising deionized water, complexing agent as defined above, and any buffering agent, optionally with the other optional ingredients, and silver is added as an aqueous solution to the other components which have been formed into a pre-mix. It has been found that this is the most advantageous way to prepare the solution because adding the silver in the form of a salt and trying to dissolve that directly into the plating f composition is relatively time consuming and tends to be more vulnerable to photo-reaction which results in precipitation of silver ions out of solution, as a dark precipitate.

Preferably the pH of the composition to which the silver salt is added will be from pH 3 to 10, most preferably from 4 to 8.

The components are mixed until they have substantially dissolved. The use of heat is disadvantageous because again, it may tend to cause the formation of a dark silver precipitate.

The metal substrate is any metal which is less electropositive than silver. It may be zinc, iron, tin, nickel, lead or, preferably copper.

Preferably, prior to contacting the metal surface with the displacement coating composition in the plating step, the metal surface is cleaned in the conventional way. Generally cleaning will be using an acidic cleaning composition, such as any cleaning composition well known in the art. Examples are copper conditioner PC1144 supplied by Alpha Metals Limited.

Where there is a cleaning step using an acidic cleaning solution, generally there will be a rinsing step prior to contacting the metal surface with the plating solution.

Optionally, there may also be a micro-etching step either combined with or after the cleaning step in which the metal surface is contacted with, for example sodium persulphate solution to remove any surface copper oxide. Where such a micro-etching step is carried out, preferably there will be a subsequent acid rinse, using sulphuric acid to remove traces of cleaning and/or microetching composition.

Contact of the metal surface with the plating composition will generally be at temperatures of from 10 to 60° C. For example, the temperature of contact with the plating solution will be from 15 to 50° C., most usually from 20 to 40° C.

Contact can be by any method, usually dip, spray or horizontal immersion coating. Spray coating is preferred. Such contact may be part of a substantially continuous coating process, that is in which excess solution is recovered and reused.

The contact time of the plating composition with the metal surface is sufficient to form a silver surface over the metal. Generally the contact time will be from 10 seconds to 10 minutes. A contact time of less than 10 seconds has generally being found to give insufficient coverage with silver coating and although the contact time may be longer than 10 minutes, no additional benefit has been found from a contact time of longer than 10 minutes.

After the plating step the silver plated surface is preferably rinsed, using, for instance an aqueous rinse solution, preferably water.

After the plating step or any subsequent rinse step the board is dried. Drying may be by any means, but is generally using warm air, for example treated metal may be passed through a drying oven.

In a particularly preferred embodiment of the invention, an oxidation inhibitor is contacted with the pads and/or through-holes either by incorporating a tarnish inhibitor in the plating solution or, by contact with a solution comprising tarnish inhibitor as a post-rinse step, after the plating step, prior to attachment of the components. Where contact with the oxidation inhibitor is in a subsequent post-rinse step by contact with a solution comprising tarnish inhibitor, there may be intermediate rinse and/or drying steps as described above. The use of such a tarnish inhibitor is advantageous as it inhibits tarnish formation on the protective plating.

The displacement plating process is an immersion displacement process and not a true electroless plating process. The coating is thus formed just on the less electropositive metal surface and not on non-metallic areas of the boards, such as the areas protected by solder mask. Since electroless silver plating compositions coat silver onto non-metallic surfaces they would have the potential to coat onto solder mask protected areas of a PCB precursors, which is clearly undesirable. The plating compositions of the present invention are more stable than plating compositions for use in electroless systems which include for example formaldehyde and which reduce silver ions to form silver precipitate. In the plating solutions of the present invention, metal atoms on the surface of the metal are oxidized by the silver ions in the solution, so that a layer of silver metal deposits on the surface of the metal surface. The process is self-limiting because when silver metal covers all of the surface sites of metal oxidizable by silver, no further reaction and therefore no further silver deposition occurs.

The present inventors have found that the rate of the displacement process may be important when a strongly adherent layer of silver is required. The presence of the complexing agent is essential to ensure that the rate of the displacement reaction is not too rapid. When the rate of the displacement reaction proceeds too quickly, the silver layer formed on the metal surface may tend to be porous, uneven and/or exhibit poor adhesion. In accordance with the present invention, the complexing agent in the plating solution ensures that the reaction process at a rate sufficient to form an adherent coating, and in addition one which has good adhesion and where the silver layer forms a protective layer, gives good protection over the metal surface to prevent the formation of oxides or other tarnish. The coating thickness of the silver coating formed according to the present invention will generally be no greater than 2 $\mu$m and is almost always less than 0.5 $\mu$m, usually about 0.1 $\mu$m.

Although the invention can be used to coat less electropositive metals for other applications (such as copper powder), the invention has been found to be particularly advantageous for forming a protective silver layer on PCBs, as a replacement for the HAL process described above. In addition to the good adhesion which is required in this application, the invention is particularly advantageous as it enables good solderability of the pads and/or through-holes of the PCB to be retained. Therefore, in a preferred aspect of the invention, the metal surface comprises pads and/or through-holes of a PCB precursor. The conductive metal pads and/or through-holes which are contacted with the plating composition in the process of the present invention may have been formed by any process for forming pads and/or through-holes.

The coating obtained using the method of the present invention produces a surface which is considerably more uniform and even than that obtained in the conventional HAL processes and, compared with organic protection, the coating is more resistant to soldering operations. Furthermore, the process of this invention is less expensive and simpler than use of the nickel/gold process.

In the subsequent component-attachment stage, the components are soldered onto the bare board and the metal of the pad(s) and/or through-holes (generally copper) and silver and/or the silver becomes mixed with the solder may tend to intermix, but the bond formed with the components has good electrical conductivity and good bond strength. The coating formed in the process of the invention is a suitable base for any solder in common use in the PCB industry tin/lead, tin/silver and tin/bismuth.

After component attachment, finished boards having components attached over the plated layer of the present invention, do not suffer joint reliability problems as do those boards formed using a nickel/gold step.

Example 1

A composition was prepared in which 50 g EDTA and 20.4 g of solid sodium hydroxide were mixed with sufficient water to dissolve them. A solution comprising 1 g silver nitrate in deionized water was subsequently added to the premixture comprising EDTA and sodium hydroxide solution and deionized water was added to 1 liter. Copper double sided circuit boards, having a variety of surface mount features and plated through-holes of various diameter were coated with the silver solution using the following procedure.

Boards were degreased with IPA, then microetched in an aqueous solution of $Na_2S_2O_8$ 5% w/w/), $H_2SO_4$ 5% w/w for 1 minute. A tap water rinse for 1 minute was then employed followed by an acid rinse in $H_3PO_4$ 5% w/w, Synperonic NP9 0.1% for 1 minute. Boards were given a further water rinse then immersed while still wet into the silver plating composition for 3 minutes at room temperature (20° C.). Upon removal from the silver bath, boards were rinsed for 1 minute with water and warm air dried. The copper areas were coated with a thin even silver deposit.

Coated boards were subjected to three passes through a typical IR solder past reflow profile—see FIG. 1 (which illustrates a suitable example of temperature against time for a reflow pass), then wave soldered using NR300, an Alpha Metals VOC free, no clear flux. 100% filling of the plated-through holes with solder was achieved.

Further boards wee stored in a humidity cabinet at 40° C./93% RH for 24 hours before being passed through 3 IR reflow profiles. These boards showed a slight degree of tarnishing on the silver coating. However 100% hole filling was still achieved during subsequent wave soldering with NR300 flux.

Example 2

A plating bath was prepared by dissolving 40 g of N,N,N',N'-tetrakis-(2-hydroxypropyl)ethylene diamines and log of citric acid in 800 cm$^3$ of deionized water. To this solution was added a solution of ig silver nitrate in 100 cm$^3$ of deionized water. The pH of this solution was adjusted to pH 8 by addition of NaOH, then made up to 1 liter with deionized water.

Copper coupons (5 cm×5 cm×0.1 cm) were silver plated in the above bath composition using the procedure as described in example 1. An adherent, thin silver coating was produced.

Example 3

A bath was prepared by dissolving 50 g of citric acid in 800 cm$^3$ of deionized water. To this solution was added a solution of 1 g silver nitrate in 100 cm$^3$ deionized water. The pH was adjusted to 4.0 with sodium hydroxide, and the bath made up to 1 liter with deionized water.

Copper coupons were silver plated using the procedure described in example 1. A thin, adherent silver coating was produced.

Example 4

A silver plating bath was prepared by dissolving 60 g of tartaric acid in 800 cm$^3$ of deionized water. To this solution was added a solution of 1 g silver nitrate in 100 cm$^3$ of deionized water. The pH of the solution was adjusted to pH 4 by addition of sodium hydroxide and the volume made up to one liter with deionized water. Copper coupons were silver plated using the procedure described in example 1. A thin, adherent silver coating was produced.

Example 5

A silver plating solution was prepared by forming a solution comprising 50 g EDTA, 20.4 g NaOH, 1 g Synperonic NP9 (ICI), 3 g Crodamet 02 (Croda Chemicals) in 800 mls deionized water. To this solution was added a solution of 1 g $AgNO_3$ in 100 mls deionized water. The pH was adjusted to 7 by addition of dilute $NaOH/HNO_3$, then made up to 1 liter with deionized water.

Double sided bare copper boards were coated with the above solution using the procedure as described in example 1. 100% filling of plated through-holes with solder was achieved during wave soldering with NR300 flux after passage through 3 IR reflow profiles.

Boards stored at 40° C./93%RH for 24 hours prior to passage through 3 IR reflow profiles showed no evidence of tarnishing and soldered well during wave soldering trials, giving 100% hole filling.

Example 6

Double side bare copper boards were coated using the bath composition and procedure as described in example 1. Following removal of the boards from the silver plating solution and rinsing, the boards were immersed in a solution of 4 g Reomet 42 an alkyl substitute/triazole tarnish inhibitor (Ciba-Geigy) in 1 liter deionized water (pH 7) for 1 minute at room temperature. The boards were then rinsed in tap water and warm air dried. A bright even silver coating was produced.

The coated boards were stored at 40° C./93% RH for 24 hours then passed through 3 IR past reflow profiles. The boards showed no evidence of tarnishing, and soldered well when wave soldered using NR300 flux.

Example 7

Coupons of copper strip (5 cm×1 cm) were coated with the various silver coatings as described in examples 1,5 and 6. In addition, further samples were coated with a commercially available immersion Sn coating and two competitors' solderability preservative coatings based on substituted benzimidazole tarnish inhibitor chemistry, i.e. containing a copper tarnish inhibitor, but no silver ions. The coupons were subjected to a variety of pre-treatments-reflow passes and storage at 40° C./93% RH—then soldered using a meniscograph with NR300 flux.

The meniscograph test method monitors the solderability by measuring the net force acting between specimen and solder. The coatings are assessed by the length of time to reach equilibrium wetting force, and the size of the equilibrium wetting force. To achieve good results in wave soldering a short wetting and high equilibrium wetting force are preferred.

The table below shows the wetting times in seconds and wetting forces after 2 seconds immersion in arbitrary units for various copper coated samples.

As can be seen from above, the silver coatings have shorter wetting times and higher wetting forces than the Sn and benzimidazole alternative and retain these properties more readily after humidity and heat treatment.

TABLE 1

| Coating | Treatment | Wet Time/Sec | WetForce/ Arb. Unit |
| --- | --- | --- | --- |
| Example 1 | As prepared | 0.6 | 0.32 |
| Example 1 | 3 Reflow Passes | 0.7 | 0.26 |
| Example 1 | 18 hrs 40° C./93% RH 0 Reflows | 0.65 | 0.30 |
| Example 1 | 18 hrs 40° C./93% RH 3 Reflows | 0.95 | 0.17 |
| Example 5 | As prepared | 0.6 | 0.31 |
| Example 5 | 3 Reflows Passes | 0.7 | 0.31 |
| Example 5 | 16 hrs 40° C./93% RH 3 Reflows | 0.7 | 0.28 |
| Example 5 | 17 days 40° C./93% RH | 1.7 | 0.12 |
| Example 5 | 17 days 40° C./93% RH 3 Reflows | 1.9 | 0.04 |
| Example 6 | As prepared | 0.7 | 0.29 |
| Example 6 | 3 Reflow Passes | 0.7 | 0.25 |
| Example 6 | 10 days 40° C./93% RH 3 Reflows | 0.9 | 0.28 |
| Sn | As prepared | 0.95 | 0.34 |

TABLE 1-continued

| Coating | Treatment | Wet Time/Sec | WetForce/ Arb. Unit |
| --- | --- | --- | --- |
| Sn | 3 Reflow Passes | >5 | −0.24 |
| Sn | 18 hrs 40° C./93% RH 0 Reflows | >5 | −0.2 |
| Sn | 18 hrs 40° C./93% RH 3 Reflows | >5 | −0.42 |
| Benzimid A | 3 Reflow Passes | 0.9 | 0.19 |
| Benzimid B | As prepared | 0.8 | 0.28 |
| Benzimid B | 1 Reflow | 0.95 | 0.26 |

Example 8

A silver plating bath was prepared by forming a solution comprising 64.8 g diethylene triamine penta-acetic acid, 23.0 g NaOH, 14 g surfactant Ethylan HB4 (Akros Chemicals), 2.5 g Crodamet 02 and ethoxylated 3° amine compound (Croda Chemicals) in 800 mls deionized water. To this solution was added a solution of 1 g silver nitrate in 100 mls deionized water. The pH of this solution was adjusted to 6.9 by addition of dilute NaOH solution or nitric acid. The volume was then made up to 1 liter using deionized water.

Double sided bare copper boards were coated using the above solution using the procedure as described in example 1. 100% filling of the plated through-holes was achieved during wave-soldering of the coated boards, using Alpha Metals NR300 flux after passage through 3 IR reflow profiles showed no evidence of tarnishing, and soldered well during wave-soldering trials giving 100% hole-fill.

What is claimed is:

1. A process for forming a silver coating on a surface of a first metal having a first electropositivity less than an electropositivity of silver, the process comprising a step of:

(a) contacting the surface of the first metal with an aqueous composition comprising silver ions and a complexing agent that is a multidentate ligand, the aqueous composition having a pH of from 2 to 12, to form a coating of silver on the surface of the first metal, wherein the aqueous composition is free of ammonium ions, thiosulphate ions and combinations thereof.

2. A process according to claim 1, wherein step (a) includes contacting the aqueous composition with a surface of the first metal having conductive metal pads, conductive metal through-holes or a combination thereof of a bare board, and in which the substrate includes non-metallic areas which remain uncoated in the process.

3. A process according to claim 1 or claim 2, wherein the surface of the first metal is a copper surface and step (a) includes contacting the copper surface with the aqueous composition.

4. A process according to claim 1, wherein step (a) includes contacting the surface of the first metal with an aqueous composition in which the complexing agent has a first molarity and the silver ions have a second molarity, the first molarity being greater than the second molarity.

5. A process according to claim 1, wherein step (a) includes contacting the surface of the first metal with an aqueous composition in which the silver ions are present at a concentration of from 0.06 g/l to 32 g/l.

6. A process according to claim 1, wherein step (a) includes contacting the surface of the first metal with an aqueous composition in which the complexing agent is present in in an amount of from 0.1 g/l to 250 g/l.

7. A process according to claim 1, wherein step (a) includes contacting the surface of the first metal with an aqueous composition in which the complexing agent is selected from the group consisting of ethylenediamine tetra-acetic acid, diethylenetriamine penta-acetic acid, N,N,N',N'-tetrakis(2-hydroxy propyl)ethylene diamine and mixtures thereof.

8. A process according to claim 1, wherein step (a) includes contacting the surface of the first metal with an aqueous composition which further includes an ingredient selected from the group consisting of a surfactant, wetting agent, stabilizer, grain refiner, tarnish inhibitor and mixtures thereof.

9. A process according to claim 8, wherein step (a) includes contacting the surface of the first metal with an aqueous composition in which a surfactant has a concentration of from 1 g/l to 15 g/l.

10. A process according to claim 1, wherein step (a) includes contacting the surface of the first metal with an aqueous composition free of any reducing agent capable of reducing the silver ions to silver metal.

11. A process according to claim 1, wherein step (a) includes a step of spraying the aqueous composition or dip-coating the aqueous composition in an immersion bath.

12. A process according to claim 1, wherein step (a) includes contacting the surface of the first metal with an aqueous composition for from 10 seconds to 10 minutes at a temperature of from 10° C. to 60° C.

13. A process according to claim 1, wherein step (a) includes contacting the surface of the first metal with an aqueous composition so that the the silver coating on the first metal is less-than 0.5 μm thick.

14. A process according to claim 1, further comprising, prior to step (a), a step of contacting the surface of the first metal with an acidic cleaning solution to clean the surface of the first metal.

15. A process according to claim 1, further comprising, prior to step (a), a step of micro-etching the surface of the first metal.

16. A process according to claim 1, further comprising steps of:
rinsing the coating of silver; and
drying the coating of silver.

17. A process according to claim 1, further comprising a step of soldering a conductor component to the coating of silver.

18. A process for producing a bare printed circuit board comprising steps of:
i) providing a substrate having exposed metal conductor traces and pads through-holes or a combination thereof, the metal having an electropositivity less than an electropositivity of silver,
ii) applying a mask to cover at least the traces and to leave at least some of the pads, the through-holes or the combination thereof exposed, the mask being an insulator, and
iii) contacting the metal surface with an aqueous composition comprising silver ions and a complexing agent that is a multidentate ligand, the aqueous composition having a pH of from 2 to 12, to form a coating of silver on the metal surface, wherein the aqueous composition is free of ammonium ions, thiosulphate ions and combinations thereof.

19. A process according to claim 1, wherein step (a) includes contacting the surface of the first metal with an aqueous composition including a buffering agent.

20. A process according to claim 4, wherein step (a) includes contacting the surface of the first metal with an aqueous composition in which the first molarity is twice as large as the second molarity.

21. A process according to claim 5, wherein step (a) includes contacting the surface of the first metal with an aqueous composition in which the silver ions are present at a concentration of from 0.1 g/l to 25 g/l.

22. A process according to claim 5, wherein step (a) includes contacting the surface of the first metal with an aqueous composition in which the silver ions are present at a concentration of from 0.5 g/l to 15 g/l.

23. A process according to claim 6, wherein step (a) includes contacting the surface of the first metal with an aqueous composition in which the complexing agent is present in an amount of from 10 g/l to 100 g/l.

24. A process according to claim 10, wherein step (a) includes contacting the surface of the first metal with an aqueous composition free of halide ions.

25. A process according to claim 12, wherein step (a) includes contacting the surface of the first metal with an aqueous composition at a temperature of from 15° C. to 50° C.

26. A process according to claim 1, wherein step (a) includes contacting the surface of the first metal with an aqueous composition that is free of ingredients selected from the group consisting of cyanide ions, formaldehyde, reducing sugars and combinations thereof.

27. A process according to claim 1, wherein step (a) includes contacting the aqueous solution with a surface of the first metal having conductive metal pads, conductive metal through-holes or a combination thereof of a bare board, and in which the substrate includes solder-mask coated areas.

28. A process according to claim 18, wherein step (a) includes contacting the surface of the first metal with an aqueous composition that is free of ingredients selected from the group consisting of cyanide ions, formaldehyde, reducing sugars and combinations thereof.

29. A process according to claim 18, wherein the exposed metal conductor is an exposed copper conductor.

30. A process according to claim 18, wherein the silver ions are present in the aqueous composition in a concentration of from 0.06 g/l to 32 gl.

31. A process according to claim 18, wherein the complexing agent of the aqueous solution has a first molarity and the silver ions of the aqueous solution have a second molarity, the first molarity being greater that the second molarity.

32. A process according to claim 18, wherein the complexing agent of the aqueous composition is present in an amount from 0.1 g/l to 250 g/l.

33. A process according to claim 18, wherein the complexing agent of the aqueous composition is selected from the group consisting of ethylenediamine tetra-acetic acid, diethylenetriamine penta-acetic acid, N,N,N',N'-tetrakis (2-hydroxy propyl) ethylene diamine and mixtures thereof.

34. A process according to claim 18, wherein the aqueous composition further includes a compound selected from the group consisting of a surfactant, a wetting agent, a stabilizer, a grain refiner, a tarnish inhibitor and mixtures thereof.

35. A process according to claim 34, wherein the complexing agent is a surfactant that has a concentration of from 1 g/l to 15 g/l in the aqueous solution.

36. A process, comprising the steps of:

applying a mask to cover a metal surface of a substrate, the metal surface having an electropositivity less than an electropositivity of silver, the mask being an insulator; and contacting the metal surface with an aqueous composition comprising silver ions and a complexing agent that is a multidentate ligand, the aqueous composition having a pH of from 2 to 12, to form a coating of silver on the metal surface, wherein the aqueous composition is free of ammonium ions, thiosulfate ions and combinations thereof.

* * * * *